United States Patent [19]

Traub et al.

[11] 4,456,833
[45] Jun. 26, 1984

[54] REGULATED POWER SUPPLY

[75] Inventors: Stefan Traub, Boblingen; Frank Rochlitzer, Altdorf, both of Fed. Rep. of Germany

[73] Assignee: Hewlett-Packard GmbH, Boeblingen, Fed. Rep. of Germany

[21] Appl. No.: 438,442

[22] Filed: Nov. 2, 1982

[30] Foreign Application Priority Data

Nov. 11, 1981 [DE] Fed. Rep. of Germany ....... 3144696

[51] Int. Cl.³ .............................................. H02J 1/00
[52] U.S. Cl. ..................................... 307/80; 323/268; 323/271; 323/285
[58] Field of Search .................. 307/4, 43, 44, 55, 64, 307/80, 85; 323/268, 269, 272, 271, 282, 284, 285

[56] References Cited

U.S. PATENT DOCUMENTS 3,227,940 1/1966 Gilbert et al. ..................... 307/80 X
3,356,855 12/1967 Suzuki et al. ..................... 323/269 X
3,414,802 12/1968 Harrigan et al. ............... 323/268 X

OTHER PUBLICATIONS

"Digital Readout System for FM Tuners", Part 2, Martin Oliver & Joe D'Elia, Practical Wireless, Dec. 1975, p. 650.

"Improving Integrity of Dualled Power Supply Monitoring", D. C. Haws, New Electronics (Great Britain), 15 May 1979, vol. 12, No. 10, p. 48.

Primary Examiner—William M. Shoop
Attorney, Agent, or Firm—Douglas A. Kundrat

[57] ABSTRACT

A linear regulated D.C. power supply includes two control elements for regulating two separate unregulated D.C. voltage sources. An enabling means is used to enable the one of the two control elements which is operating at the lower instantaneous power dissipation level and to supply the regulated output of that selected control element to a load.

20 Claims, 2 Drawing Figures

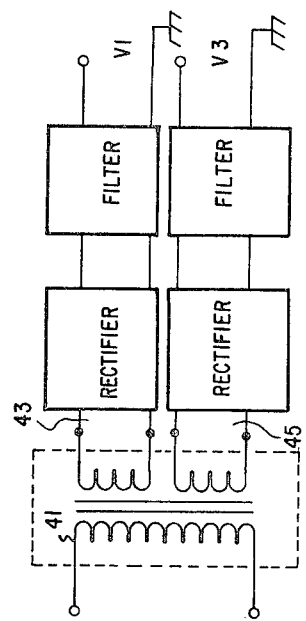
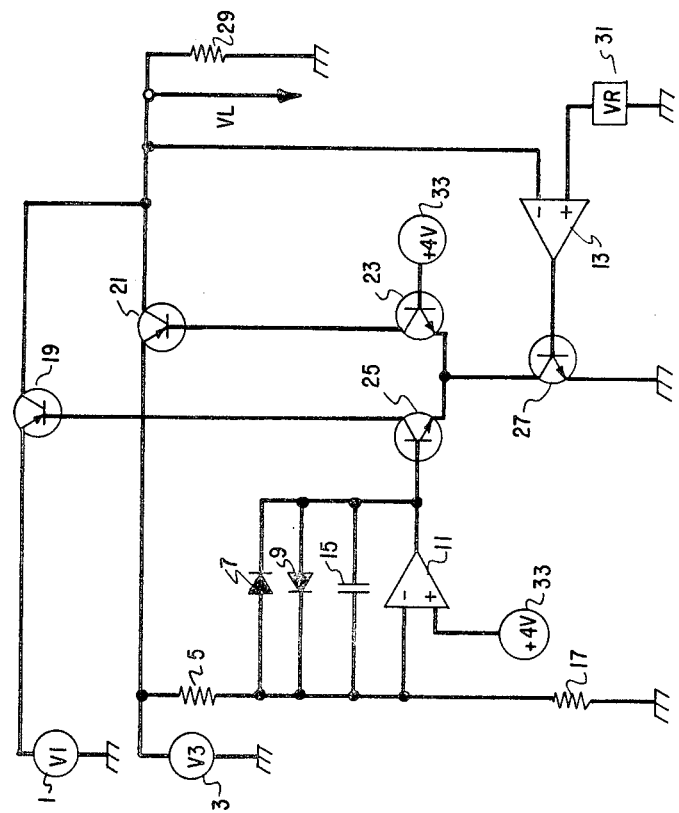
FIG 2
FIG 1

REGULATED POWER SUPPLY

BACKGROUND OF THE INVENTION

Two distinct types of power supplies, switching and linear, are used for providing regulated D.C. voltages to, e.g., electrical circuits. Switching power supplies have the advantage of being highly efficient in that they operate at an efficiency which is generally between 70 and 80%. However, switching power supplies have the drawback of being expensive because of the complex circuitry and the high power components which are required. Moreover, heat dissipation is a major problem in switching power supplies because the power devices used are typically allowed to float electrically and, therefore, cannot easily be mounted on heat sinks.

In contrast, the circuitry of a linear power supply is relatively simple and the power devices used are easily mounted on grounded heat sinks since most of the heat to be dissipated is generated by a transformer, rectifier diodes and a series-connected output control transistor. The main disadvantage associated with the use of a linear power supply is that the typical efficiency of about 30% is much lower than the efficiency of a comparable switching power supply.

The efficiency of a linear power supply is dependent upon the difference between the unregulated D.C. supply voltage and the regulated power supply output voltage. As this voltage difference increases, the power dissipation of the power supply control transistor increases and, consequently, the overall efficiency of the power supply decreases.

In U.S. Pat. No. 3,414,802, issued to Harrigan et al, a linear power supply having an improved efficiency is disclosed. This power supply comprises two separate control loops wherein each control loop includes a series control transistor. Each control loop is connected to a different unregulated D.C. voltage source and the outputs of the control loops are connected in parallel across a common load. The nominal output voltage level of the first control loop, which is supplied by the higher of the two unregulated D.C. voltages, is slightly lower than the nominal output voltage level of the second control loop. If the second control loop is operating within its operating range the first control loop will be disabled. If the unregulated D.C. input voltage supplied to the second control loop drops to a level at which it is impossible to maintain the output voltage level, the first control loop will begin to operate. Since the nominal output voltage levels of the two control loops are slightly different there exists a voltage step in the power supply output voltage at the transition point between the two control loop output voltage levels. This voltage step is disadvantageous in applications where an exact output voltage is required. Further, at the transition point the second control loop control transistor is still turned on and is dissipating power. Although the dual control loop power supply disclosed by Harrigan et al achieves a higher efficiency than that of single control loop linear power supplies, this efficiency is still less than that of typical switching power supplies.

SUMMARY OF THE INVENTION

According to the illustrated preferred embodiment of the present invention, an output voltage at a desired load voltage level is supplied to a load by a regulated linear D.C. power supply. The regulated linear D.C. power supply receives different first and second unregulated D.C. voltages. The first unregulated D.C. voltage varies between first maximum and minimum voltage levels centered around a first nominal voltage level. The second unregulated D.C. voltage varies, in conformity with the first unregulated D.C. voltage, between second maximum and minimum voltage levels centered around a second nominal voltage level. Said regulated linear D.C. power supply includes a first constant reference voltage source and a first comparator circuit for comparing the output voltage with the first reference voltage. A first control element receives the first unregulated D.C. voltage and generates a first output voltage therefrom according to the output of the first comparator circuit. A second control element receives the second unregulated D.C. voltage and generates a second output voltage therefrom. A switching circuit is driven by a second comparator circuit which compares one of the unregulated D.C. voltages with a second constant reference source. According to the result of this comnparison, the switching circuit enables that control element which is dissipating the least instantaneous power and which is also able to supply an output voltage which is equal to the desired load voltage. Thus, power dissipation is minimized, efficiency is maximized, and a constant load voltage is achieved.

For optimum performance, the ratio of the higher nominal unregulated D.C. voltage level to the lower should be one half of the ratio of the maximum unregulated D.C. voltage level to the minimum unregulated D.C. voltage level.

BRIEF DESCRIPTION OF THE DRAWINGS

FIG. 1 is a schematic diagram of a linear regulated D.C. power supply which is constructed according to the preferred embodiment of the present invention.

FIG. 2 shows a dual output transformer circuit which may be used to supply two D.C. voltages to the power supply shown in FIG. 1.

DETAILED DESCRIPTION OF THE PREFERRED EMBODIMENT

In FIG. 1 there is shown a schematic diagram of a power supply which is constructed according to the preferred embodiment of the present invention. Voltage sources 1 and 3 are unregulated D.C. supplies which supply voltages V1 and V3, respectively. V1 is higher than V3 and the two voltages vary in conformity with one another, that is, V1/V3 remains substantially constant. As shown in FIG. 2, voltages V1 and V3 may easily be generated by rectifying and capacitively filtering the outputs of two different sets of taps 43, 45, on a secondary winding of a power transformer 41. Voltage sources 1 and 3 are connected to a load 29 via the emitter-collector paths of PNP transistors 19 and 21, respectively. Transistors 19 and 21 may comprise, for example, 2N5883 power devices. In the circuit depicted in FIG. 1, the desired constant output voltage, VL, to be developed across load 29 is +5 volts, the nominal value of voltage V1 is +9.5 volts, and the nominal value of voltage V3 is +6.5 volts.

The emitters of differential pair transistors 25 and 23 are connected to the bases of transistors 19 and 21, respectively. The emitters of transistors 25 and 23 are connected to ground through the emitter-collector path of a transistor 27. Transistors 23, 25, and 27 may comprise any of a number of commercially available NPN transistors such as, e.g. a 2N2219A device. The base of transistor 23 is connected to a constant D.C. voltage source 33 which supplies +4 volts. The base of transistor 25 is connected to an output of an operational amplifier 11 which may comprise, for example, a National Semiconductor LM307H. The non-inverting input of operational amplifier 11 is connected to voltage source 33. The inverting input of operational amplifier 11 is connected to a voltage divider consisting of a 15 kilohm resistor 5 (R5) and a 40 kilohm resistor 17 (R17). Said voltage divider is connected between voltage source 3 and ground. A negative feedback loop around operational amplifier 11 includes a parallel connection of diodes 7 and 9 and a capacitor 15. Diodes 7 and 9 may comprise, e.g., 1N485B devices and the value of capacitor 15 is 1 nanofarad.

The base of transistor 27 is connected to an output of an operational amplifier 13 such as a National Semiconductor LM307H. The inverting input of operational amplifier 13 is connected to load 29 and the non-inverting input is connected to a reference source 31 which is set to the desired value of load voltage, VL.

Since the output voltage of operational amplifier 11 is equal to (V3)((R17/(R5+R17)) volts ± the voltage drop across diodes 7 and 9, only one of transistors 23 and 25 is turned on at any given time. Thus, only one of transistors 19 and 21 is on at any given time and the other transistor is off. The conducting one of transistors 19 and 21 is driven by the output of operational amplifier 13 via transistor 27 and one of transistors 23 and 25. Persons of ordinary skill in the art will be able to select current limiting resistors, not shown in FIG. 1, to protect the base-emitter junctions of transistors 23, 25, and 27. It should be noted that there are two voltage control loops in the circuit of FIG. 1 (a first includes transistors 19 and 25 and a second includes transistors 21 and 23) and that at any given time only one is operative and the other is disabled. Well known feedback circuitry (not shown) may be employed around operational amplifier 13 to optimize the control function.

Resistors 5 and 17 are selected so that transistor 21 is turned on so long as voltage V3 is sufficient for transistor 21 to supply the desired load voltage at load 29. In order to meet this constraint in the circuit of FIG. 1, voltage V3 must be at least +5.5 volts. Should voltage V3 drop below +5.5 volts, the output of operational amplifier 11 turns transistor 25 on and transistor 23 off. As a consequence of this, transistor 19 is turned on and transistor 21 is turned off. Thus, transistor 19 takes over the control function and uses voltage V1 to provide the desired regulated load voltage, VL, at load 29. The negative feedback circuit consisting of diodes 7 and 9 and capacitor 15 ensures that a smooth transition between the operation of transistor 19 and the operation of transistor 21 is achieved within a given takeover range. Thus, the transition does not cause voltage steps to occur in load voltage VL.

If voltage sources 1 and 3 comprise taps on a secondary winding of a power transformer as discussed hereinabove, oscillatory switching at an A.C. line frequency might occur in the takeover range. But, because the transitions between transistor 19 and transistor 21 are smooth, the quality of output voltage, VL, is not affected.

If only normal variations in supply voltages V1 and V3 are expected, the circuit of FIG. 1 should be constructed with the ratio (V1 nominal)/(V3 nominal) equal to about one half of the ratio (V1 maximum)/(V3 minimum). In the circuit depicted in FIG. 1, transistors 19 and 21 always operate within ranges where the emitter-collector resistance is relatively small and, thus, the efficiency of the circuit typically exceeds 50%.

I claim:

1. A power supply for supplying a predetermined regulated voltage at a load, said power supply comprising:
   a first input for receiving a first voltage which varies between first maximum and minimum voltage levels around a first nominal voltage level;
   a second input for receiving a second voltage which varies between second maximum and minimum voltage levels around a second nominal voltage level;
   first control means, coupled between the first input and the load, for receiving the first voltage and for presenting a third voltage at the load, the third voltage being substantially equal to the predetermined regulated voltage;
   second control means, coupled between the second input and the load, for receiving the second voltage and for presenting a fourth voltage at the load, the fourth voltage being substantially equal to the predetermined regulated voltage;
   enabling means, coupled to the first and second control means, for selectively enabling one of the control means and for disabling the other control means; and
   wherein a ratio of the nominal first voltage level to the nominal second voltage level is substantially equal to one half of a ratio of the maximum first voltage level to the minimum second voltage level.

2. A power supply for supplying a predetermined regulated voltage at a load, said power supply comprising:
   a first input for receiving a first voltage which varies between first maximum and minimum voltage levels around a first nominal voltage level;
   a second input for receiving a second voltage which varies between second maximum and minimum voltage levels around a second nominal voltage level;
   first control means, coupled between the first input and the load, for receiving the first voltage and for presenting a third voltage at the load, the third voltage being substantially equal to the predetermined regulated voltage;
   second control means, coupled between the second input and the load, for receiving the second voltage and for presenting a fourth voltage at the load, the fourth voltage being substantially equal to the predetermined regulated voltage; and
   enabling means, coupled to the first and second control means, for selectively enabling the one of the control means which is operating at a lower power dissipation level than the other control means and for disabling said other control means.

3. A power supply as in claim 2, wherein the enabling means is also coupled to the second input and is operative for enabling the first control means if the second voltage is less than a control voltage level and for enabling the second control means if the second voltage is greater than the control voltage level.

4. A power supply as in claim 3, wherein the first nominal voltage level is greater than the second nominal voltage level.

5. A power supply as in claim 4, wherein the control voltage level is the minimum level of the second voltage at which the second control means is able to maintain the fourth voltage substantially equal to the predetermined regulated voltage.

6. A power supply as in claim 5, wherein a ratio of the nominal first voltage level to the nominal second voltage level is substantially equal to one half of a ratio of the maximum first voltage level to the minimum second voltage level.

7. A power supply as in claim 5, wherein the second voltage varies in conformity with the first voltage.

8. A power supply as in claim 7, wherein the first and second supply means comprise taps on a transformer.

9. A power supply as in claim 8, wherein a ratio of the nominal first voltage level to the nominal second voltage level is substantially equal to one half of a ratio of the maximum first voltage level to the minimum second voltage level.

10. A power supply as in claim 3 wherein the first and second control means comprise first and second pass transistors.

11. A power supply as in claim 10, wherein:
the first pass transistor comprises a PNP power transistor having an emitter connected to the first input and a collector connected to the load; and,
the second pass transistor comprises a PNP power transistor having an emitter connected to the second input and a collector connected to the load.

12. A power supply as in claim 11, wherein the enabling means comprises:
current source means having a first end and a second end which is connected to ground, said current source means being operative for sourcing current at the first end;
a first reference source for generating a first reference voltage;
a first switching transistor having a collector connected to a base of the first pass transistor and an emitter connected to the first end of the current source means;
a second switching transistor having a collector connected to a base of the second pass transistor, a base connected to the first reference source, and an emitter connected to the first end of the current source means;
divider means, connected between the second input and ground, for presenting a divided second voltage at an output; and,
first comparator means, having a first input connected to the divider means output, a second input connected to the first reference source, and an output connected to a base of the first switching transistor, said first comparator means being operative for turning the first switching transistor on and the second switching transistor off if the first reference voltage is greater than the divided second voltage and for turning the first switching transistor off and the second switching transistor on if the divided second voltage is greater than the first reference voltage.

13. A power supply as in claim 12, wherein the current source means comprises:
a second reference source for generating a second reference voltage;
a source transistor having an emitter connected to ground and a collector connected to the emitters of the first and second switching transistors; and,
a second comparator having an output connected to a base of the source transistor, an inverting input connected to the collectors of the first and second pass transistors, and a non-inverting input connected to the second reference source.

14. A power supply as in claim 13, wherein the second reference voltage is substantially equal to the predetermined regulated voltage.

15. A power supply as in claim 14, wherein the first nominal voltage level is greater than the second nominal voltage level.

16. A power supply as in claim 15, wherein the control voltage level is the minimum level of the second voltage at which the second control means is able to maintain the fourth voltage substantially equal to the predetermined regulated voltage.

17. A power supply as in claim 16, wherein a ratio of the nominal first voltage level to the nominal second voltage level is substantially equal to one half of a ratio of the maximum first voltage level to the minimum second voltage level.

18. A power supply as in claim 17, wherein the second voltage varies in conformity with the first voltage.

19. A power supply as in claim 18, wherein the first and second supply means comprise taps on a transformer.

20. A power supply as in claim 19, wherein the first reference voltage is substantially equal to the divided second voltage when the second voltage is equal to the control voltage level.

* * * * *